(12) United States Patent
Zahurak et al.

(10) Patent No.: US 7,064,036 B2
(45) Date of Patent: *Jun. 20, 2006

(54) DUAL-GATE TRANSISTOR DEVICE AND METHOD OF FORMING A DUAL-GATE TRANSISTOR DEVICE

(75) Inventors: John K. Zahurak, Boise, ID (US); Brent Keeth, Boise, ID (US); Charles H. Dennison, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 144 days.

This patent is subject to a terminal disclaimer.

(21) Appl. No.: 10/932,192

(22) Filed: Sep. 1, 2004

(65) Prior Publication Data

US 2005/0142703 A1 Jun. 30, 2005

Related U.S. Application Data

(63) Continuation of application No. 10/455,975, filed on Jun. 6, 2003, now Pat. No. 6,790,732, which is a continuation of application No. 09/844,184, filed on Apr. 27, 2001, now Pat. No. 6,593,192.

(51) Int. Cl.
*H01L 21/336* (2006.01)

(52) U.S. Cl. .................. 438/283; 438/285; 438/587

(58) Field of Classification Search ........ 438/197–200, 438/216, 217, 223, 226, 231, 232, 268, 269, 438/270, 285, 300–306, 311, 593, 149, FOR 210, 438/142, 585–587; 257/E27.112, E21.32, 257/E31.545, 347–354, E21.112

See application file for complete search history.

(56) References Cited

U.S. PATENT DOCUMENTS

| | | | |
|---|---|---|---|
| 5,115,289 A | 5/1992 | Hisamoto et al. | |
| 5,154,661 A | 10/1992 | Higgins | 62/3.3 |
| 5,164,805 A | 11/1992 | Lee | |
| 5,259,737 A | 11/1993 | Kamisuki et al. | 417/322 |
| 5,262,352 A | 11/1993 | Woo et al. | |
| 5,313,094 A | 5/1994 | Beyer et al. | 257/622 |
| 5,569,950 A | 10/1996 | Lewis et al. | 257/467 |
| 5,621,239 A | 4/1997 | Horie et al. | |
| 5,646,058 A | 7/1997 | Taur et al. | |
| 5,736,435 A | 4/1998 | Venkatesan et al. | |
| 5,753,529 A | 5/1998 | Chang et al. | 437/67 |
| 5,757,081 A | 5/1998 | Chang et al. | 257/788 |
| 5,759,014 A | 6/1998 | Van Lintel | 417/413.3 |
| 5,767,578 A | 6/1998 | Chang et al. | 257/717 |

(Continued)

OTHER PUBLICATIONS

Larry Gilg et al., "Die Products: ideal IC packaging for demanding applications", Electronic Design, Dec. 23, 2002, pp. 47-50.

(Continued)

*Primary Examiner*—Brook Kebede
(74) *Attorney, Agent, or Firm*—Wells St. John P.S.

(57) ABSTRACT

Embodiments in accordance with the present invention provide methods of forming a dual gated semiconductor-on-insulator (SOI) device. Such methods encompass forming a first transistor structure operatively adjacent a first side of the semiconductor layer of an SOI substrate. Insulator layer material is removed from the second side of the semiconductor layer, between the source/drain contact structures of the first transistor structure and a second transistor structure there formed operatively adjacent the second side of the semiconductor layer and aligned to the first transistor structure.

9 Claims, 12 Drawing Sheets

U.S. PATENT DOCUMENTS

| | | | |
|---|---|---|---|
| 5,885,887 A | | 3/1999 | Hause et al. |
| 5,970,339 A | * | 10/1999 | Choi .................... 438/243 |
| 6,004,837 A | | 12/1999 | Gambino et al. |
| 6,063,686 A | | 5/2000 | Masuda et al. |
| 6,080,608 A | | 6/2000 | Nowak .................... 438/151 |
| 6,121,661 A | | 9/2000 | Assaderaghi et al. |
| 6,284,594 B1 | | 9/2001 | Ju et al. |
| 6,320,225 B1 | | 11/2001 | Hargrove et al. |
| 6,337,505 B1 | | 1/2002 | Hwang et al. |
| 6,365,450 B1 | | 4/2002 | Kim |
| 6,376,312 B1 | | 4/2002 | Yu |
| 6,391,752 B1 | | 5/2002 | Colinge et al. |
| 6,396,108 B1 | | 5/2002 | Krivokapic et al. |
| 6,406,962 B1 | * | 6/2002 | Agnello et al. ............. 438/268 |
| 6,429,477 B1 | * | 8/2002 | Mandelman et al. ....... 257/301 |
| 6,573,551 B1 | | 6/2003 | Kim et al. |
| 6,573,565 B1 | * | 6/2003 | Clevenger et al. .......... 257/355 |
| 6,593,192 B1 | * | 7/2003 | Zahurak et al. ............. 438/283 |
| 6,599,797 B1 | * | 7/2003 | Hofmann et al. ........... 438/248 |
| 6,790,732 B1 | * | 9/2004 | Zahurak et al. ............. 438/283 |

OTHER PUBLICATIONS

M. Armacost et al., "Plasma-etching processes for ULSI semiconductor circuits", IBM J. Res. Develop., vol. 43, No. 1/2, Jan./Mar. 1999, pp. 39-72.

Wann, C., et al., "A Comparative Study of Advanced MOSEFET Concepts", IEEE Oct. 1996, pp. 1742-1752.

Tanaka, T., et al.; "Analysis of $P^+$ Poly Si Double-Gate Thin-Film SOI MOSFETS", IEEE 1991, pp. 683-686.

Hisamoto, D., et al.; A Fully Depleted Lean Channel Transistor (DELTA) -novel vertical ultra thin SOI MOSFET-: IEEE 1989, pp. 833-836.

Frank, D., et al.,; "Monte Carlo Simulation of a 30nm Dual-Gate MOSFET: How Short Can Si Go?", IEEE 1992, pp. 553-556.

Tanaka, T., et al.; "Ultrafast Operation of Vth-Adjusted $p^+$-$n^+$ Double-Gate SOI MOSFET's"; IEEE 1994, pp. 386-388.

Radack, Daniel J., "Advanced Microelectronics: The Role of SOI", IEEE International SOI Conference, Oct. 1999, pp. 5-7.

Sunouchi, k., et al.; "A Surrounding Gate Transistor (SGT) Cell for 64/256Mbit DRAMs", IEEE 1989, pp. 23-24 and 26.

* cited by examiner

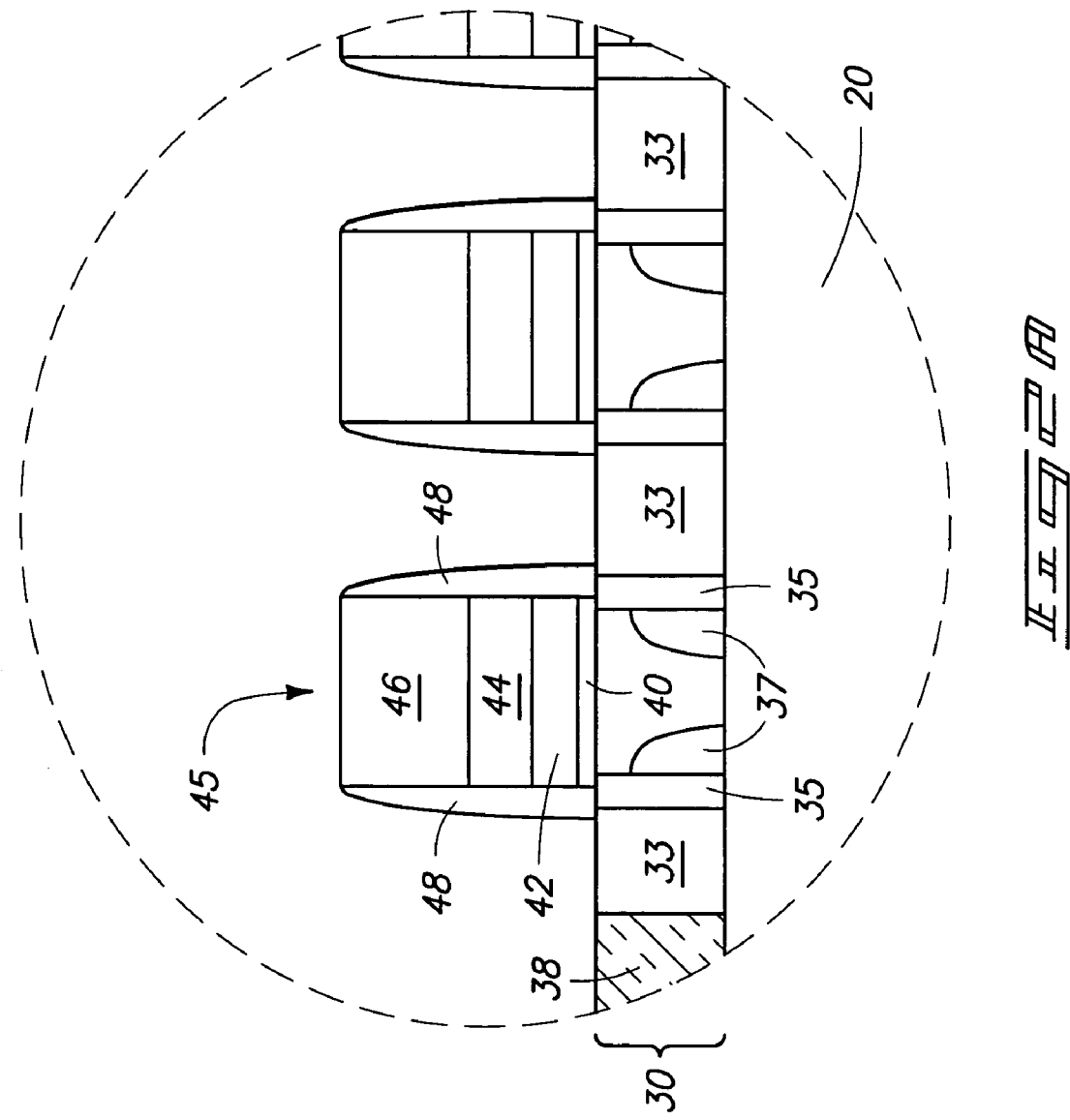

DUAL-GATE TRANSISTOR DEVICE AND METHOD OF FORMING A DUAL-GATE TRANSISTOR DEVICE

RELATED PATENT DATA

This patent resulted from a continuation application of U.S. patent application Ser. No. 10/455,975, filed Jun. 6, 2003, now U.S. Pat. No. 6,790,732, which resulted from a continuation application of U.S. patent application Ser. No. 09/844,184 which was filed on Apr. 27, 2001, now issued as U.S. Pat. No. 6,593,192.

TECHNICAL FIELD

The present invention relates generally to methods of fabricating dual-gate transistors and more specifically to methods of fabricating such transistors with self-aligned gate structures on semiconductor on insulator substrates.

BACKGROUND

Increased performance, both with regard to more complex functionality and higher speeds, is generally the goal of efforts in advancing the semiconductor arts. One method that has been used for achieving this goal is scaling downward the size of transistors used in advanced semiconductor devices. However, as devices have become smaller, such scaling has become problematic due to short channel effects, insufficient drive voltages and inadequate sub-threshold performance. Thus to continue to increase or enhance device performance, particularly transistor device structures, it would be desirable to create transistor device structures that overcome or reduce the above mentioned problems.

One such transistor structure that theoretically offers advantages that overcome the aforementioned problems of scaling device size downward is the dual-gated transistor structure. However, such transistors have proven difficult to fabricate, making it difficult to take advantage of increased drive current and sub-threshold performance. This difficulty is the result of the absence of a technique or method for accurately aligning the front and back gate structures to one another. As a result of this deficiency, alternate transistor structures that do not offer all of the advantages of dual-gate transistors have been pursued. Exemplary of such alternate structures are "surround gate" and "DELTA" gate transistors. However, while such alternate devices provide some of the benefit predicted for dual-gated transistors, these partial benefits are only realized at the expense of difficult manufacturing processes that result in an integrated circuit having highly irregular surface topology due to the vertical nature of such alternate devices.

It would therefore be advantageous to have methods for forming dual-gated transistor devices that employ straightforward semiconductor fabrication methods. It would also be advantageous if such methods would be useful to form dual-gated transistors that have an essentially standard transistor surface profile, thus avoiding the problematic highly irregular surface topology of the aforementioned alternate devices. In addition, it would be advantageous if such methods could be employed to form such dual-gated transistor devices having high drive current and superior sub-threshold performance.

SUMMARY

Embodiments in accordance with the present invention provide methods of fabricating dual-gated transistor structures. Thus, a first transistor gate is formed adjacent a first side of the semiconductor layer of a semiconductor-on-insulator (SOI) substrate and source/drain (S/D) contact structures are formed proximate laterally opposing sides of the first transistor gate structure. These S/D structures are formed such that they extend into the insulator layer, adjacent a second side of the semiconductor layer opposing the first side, of the SOI substrate. Subsequently, material of the insulator layer is removed from between the S/D contact structures. After the removing, second transistor gate structures are formed adjacent the second side, between the S/D contact structures.

Generally, embodiments in accordance with the present invention provide that the S/D contact structures are operatively coupled to both the first and second gates as well as to S/D regions formed in the semiconductor layer. Such embodiments also provide that the first and the second transistor gates are formed on opposing sides of a semiconductor layer in such a manner that the gates are self-aligned to one another to define, and provide for control of, a common channel region.

In some embodiments of the present invention, the S/D contact structures are spaced from the first gate structure by spacer structures formed from an insulating material. Thus the spacer structures serve to define the position of such the source/drain contact structures laterally, with respect to the gate structures, a first portion of the S/D contact structures being adjacent the spacers.

In embodiments in accordance with the present invention, the S/D contact structures of the first transistor are formed to extend into the insulating layer of the SOI substrate. In some embodiments, such S/D structures extend through the insulating layer and into the bulk semiconductor substrate.

BRIEF DESCRIPTION OF THE DRAWINGS

Embodiments in accordance with the present invention are described below with reference to the following accompanying drawings.

FIG. 2a is an enlarged cross-sectional view of the indicated portion of FIG. 2.

FIG. 7 depicts the structure of FIG. 6 after additional processing in accordance with embodiments of the present invention.

DETAILED DESCRIPTION

This disclosure of the invention is submitted in furtherance of the constitutional purposes of the U.S. Patent Laws "to promote the progress of science and useful arts" (Article 1, Section 8).

Figure 1:
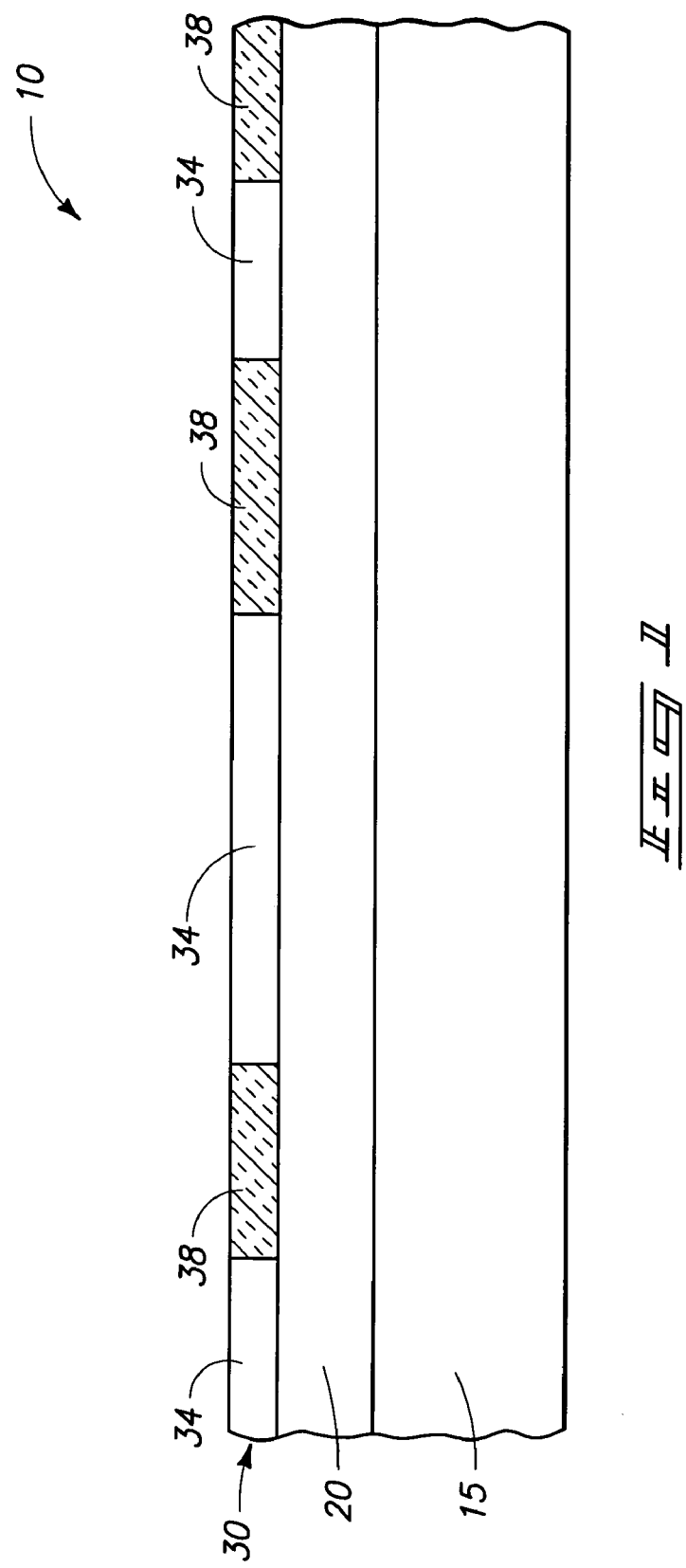
FIG. 1 is a cross-sectional view of a portion of a semiconductor-on-insulator (SOI) substrate at an early stage in the formation of a first transistor gate structure in accordance with embodiments of the present invention.

Referring to FIG. 1, a cross-sectional view of a portion of semiconductor-on-insulator (SOI) substrate 10 at an early stage in the formation of a dual-gated transistor is depicted. A bulk or initial substrate 15 is shown having an insulator layer 20 and a semiconductor or device layer 30 disposed thereover. Insulator layer 20 generally encompasses a silicon oxide material, although other insulating materials such as silicon nitride or oxynitrides can be employed and often is referred to as a buried oxide or buried insulator layer. Insulator layer 20 generally has a thickness in the range of about 20 nanometers (nm) to about 500 nm, with about 150 nm being typical. Bulk substrate. 15 is typically a lightly doped, conventional single crystal silicon substrate. SOI substrate 10 is generally formed by any of the known, conventional methods for forming such substrates. These conventional methods include, but are not limited to, wafer bonding techniques, methods that employ an implantation such as SIMOX (separation by implanted oxygen), and ZMR (zone melting recrystallization). However, any other appropriate method of forming SOI substrate 10 that is known or that becomes known is within the scope and spirit of the present invention.

An example material for layer 30 is single crystal silicon material, although other appropriate semiconductor materials can be employed. Device layer 30 generally has thickness in the range of from about 20 nanometers (nm) to about 200 nm where thickness of about 100 nm is typical. In addition, layer 30 is generally formed having an appropriate concentration of either a P-type dopant or an N-type dopant, although in some embodiments the appropriate dopant is provided after device layer 30 is formed.

Semiconductor layer 30 has active area regions 34 and laterally adjacent isolation regions 38. Isolation regions 38 are typically formed by conventional shallow trench isolation (STI) methods, although other appropriate isolation methods can also be used. Where an STI method is employed for forming isolation regions 38, typically, portions of layer 30 are removed to form trenches (not shown) extending to and exposing underlying regions of insulation layer 20. Such trenches are then filled with a dielectric material, for example silicon dioxide. After the filling, the structure is planarized, for example by a chemical mechanical polishing (CMP) process, to provide an essentially planar surface.

Figure 2:
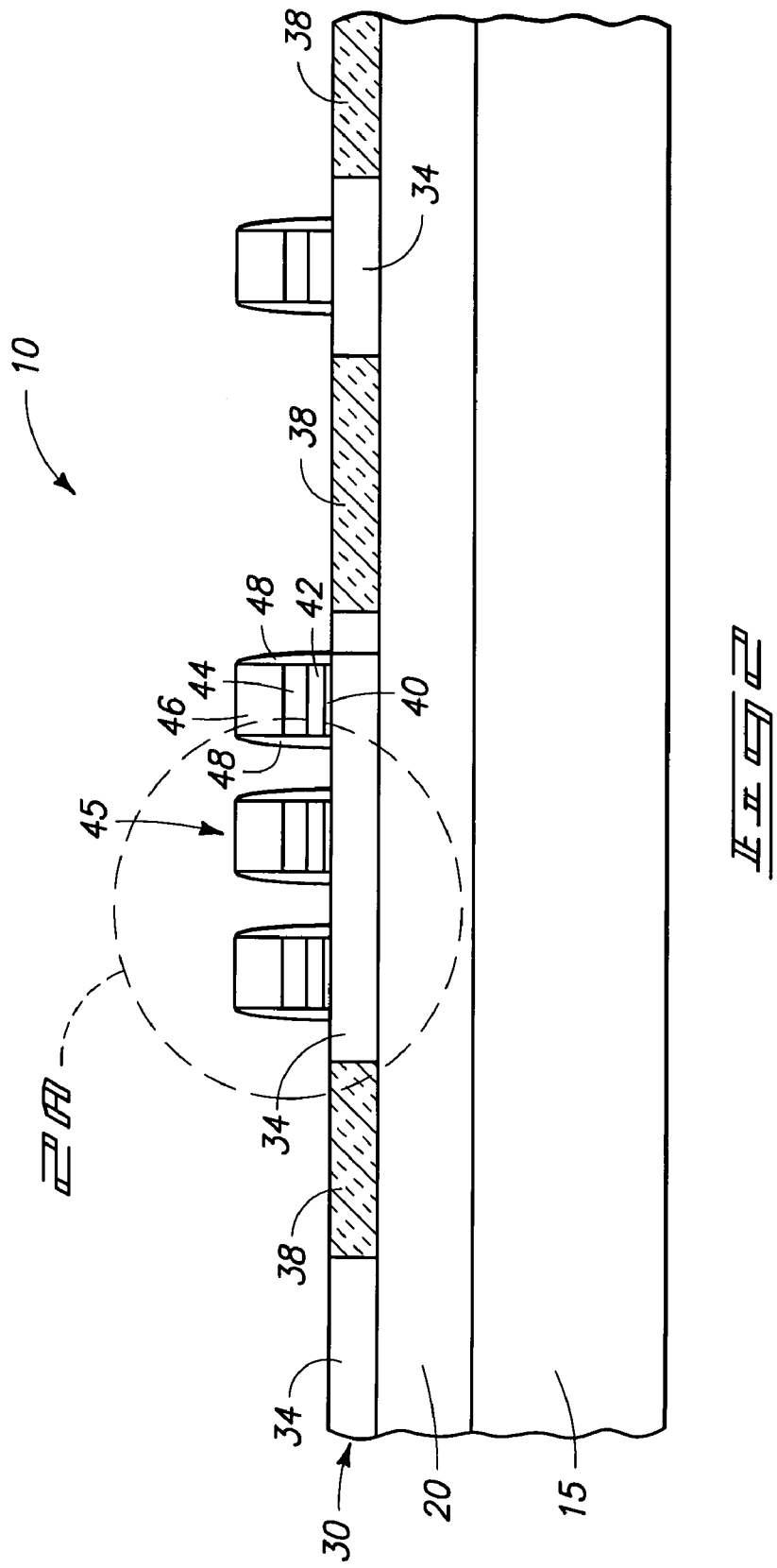
FIG. 2 depicts the structure of FIG. 1 after additional processing in accordance with embodiments of the present invention.

Referring to FIG. 2, the structure of FIG. 1 is shown having first transistor gate structures 45 disposed over active areas 34. First gate structures 45 are generally formed by conventional deposition, patterning and etching methods and encompass a first gate dielectric 40, a first gate electrode 42, a first conductive layer 44 and a first capping layer 46. An exemplary gate dielectric material is a silicon dioxide material formed to have a thickness of between about 2 nm to about 20 nm. A thickness, for gate dielectric 40, of about 4 nm is typical.

Embodiments of the present invention, generally employ a material encompassing polycrystalline silicon for gate electrode 42, although other appropriate materials can be employed. Such polysilicon material is generally formed using conventional low pressure chemical vapor deposition (LPCVD) methods and has a nominal thickness of about 80 nm. Some embodiments employ thicker or thinner polysilicon for first electrode 42, the range from about 30 nm to about 200 nm being typical. First conductive layer 44 is generally a silicide material such as titanium silicide, however, non-silicide materials such as titanium-tungsten (TiW) or tungsten (W) are also appropriate for conductive layer 44. Finally, first capping layer 46 is generally a dielectric material such as silicon dioxide, silicon nitride or an oxynitride, and is formed having an appropriate thickness in the range of from about 100 nm to about 300 nm.

For ease of understanding and explanation, FIG. 2a is used to depict source/drain (S/D) regions 33, lightly doped drain (LDD) regions 35 and halo regions 37 which are operably adjacent first transistor gate structure 45. Such regions can be formed using conventional or other methods. For example, in a N-channel embodiment of the present invention, LDD regions 35 are generally formed by implantation of an N-type dopant such as arsenic into active area regions 34, gate structures 45 serving to mask or shield portions of region 34, thereunder. A dose of about 9 E13 ions/cm$^2$ or greater is exemplary. First dielectric sidewall spacers 48 are then formed, generally of silicon dioxide, silicon nitride or an oxynitride, laterally adjacent opposing sides of gate structures 45. A second implant of an N-type dopant is used to form S/D regions 33, spaced laterally outward from gate structure 45, where gate structures 45 and spacers 48 serve to mask or shield portions of region 34, thereunder. An arsenic dose of 2 E15 ions/cm$^2$ or greater is exemplary for the S/D forming implant. While both the LDD and S/D implants are performed at standard implantation angles, where an embodiment of the present invention employs halo regions 37, an angled implantation of a dose of boron, or another appropriate P-type dopant, between about 2 E12 to about 2.5 E12 ions/cm$^2$ is generally employed. While the specific angle of the implant can vary as a function of the device characteristics desired, generally an angle of between about 10° to about 60° from normal is employed.

In addition, it will be understood that the forming of the regions described above is for illustrative purposes only, and that other dopants and doses of such dopants can be used for the regions described, and that such other dopants and doses are with in the scope and spirit of the present invention. For example, some embodiments in accordance with the present invention encompass P-channel devices and employ appropriate P-type dopants for S/D and LDD regions. Other embodiments encompass additional regions to provide more extensively tailored S/D regions than described above and still other embodiments do not encompass halo regions 37. It will also be understood that embodiments of the present invention also include any of the various channel tailoring processes that can be employed, for example, some embodiments of the present invention include one or more threshold adjust implant processes.

Figure 3:
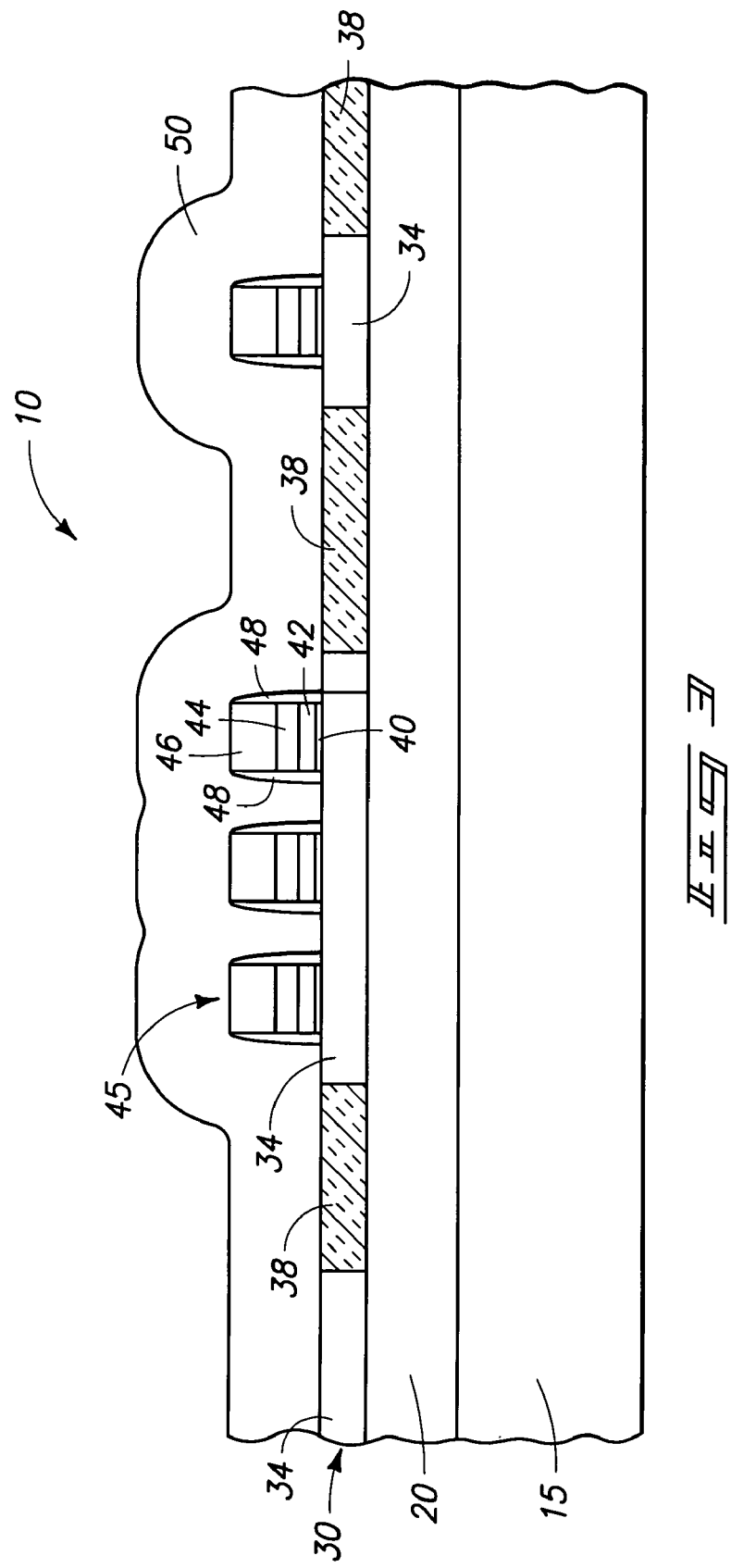
FIG. 3 depicts the structure of FIG. 2 after additional processing in accordance with embodiments of the present invention.

FIG. 3 depicts the structure of FIG. 2 subsequent to the initial forming of a first insulating layer 50. While not shown, in some embodiments of the present invention first insulating layer 50 encompasses both an initially formed conformal layer and a subsequently formed bulk layer. Generally such a conformal portion of layer 50 is formed by a conventional chemical vapor deposition (CVD) process, such as one employing the low pressure and/or plasma enhanced decomposition of tetraethyl orthosilicate (TEOS), and has a thickness of between about 5 nm to 50 nm. The bulk portion of first layer 50 while also generally employing a CVD process, is typically a borophosphosilicate glass (BPSG). In total, the thickness of layer 50, as formed, is nominally about 1000 nm which is sufficient to cover first gate structures 45, although other total thickness that cover structures 45 are also appropriate.

Figure 4:
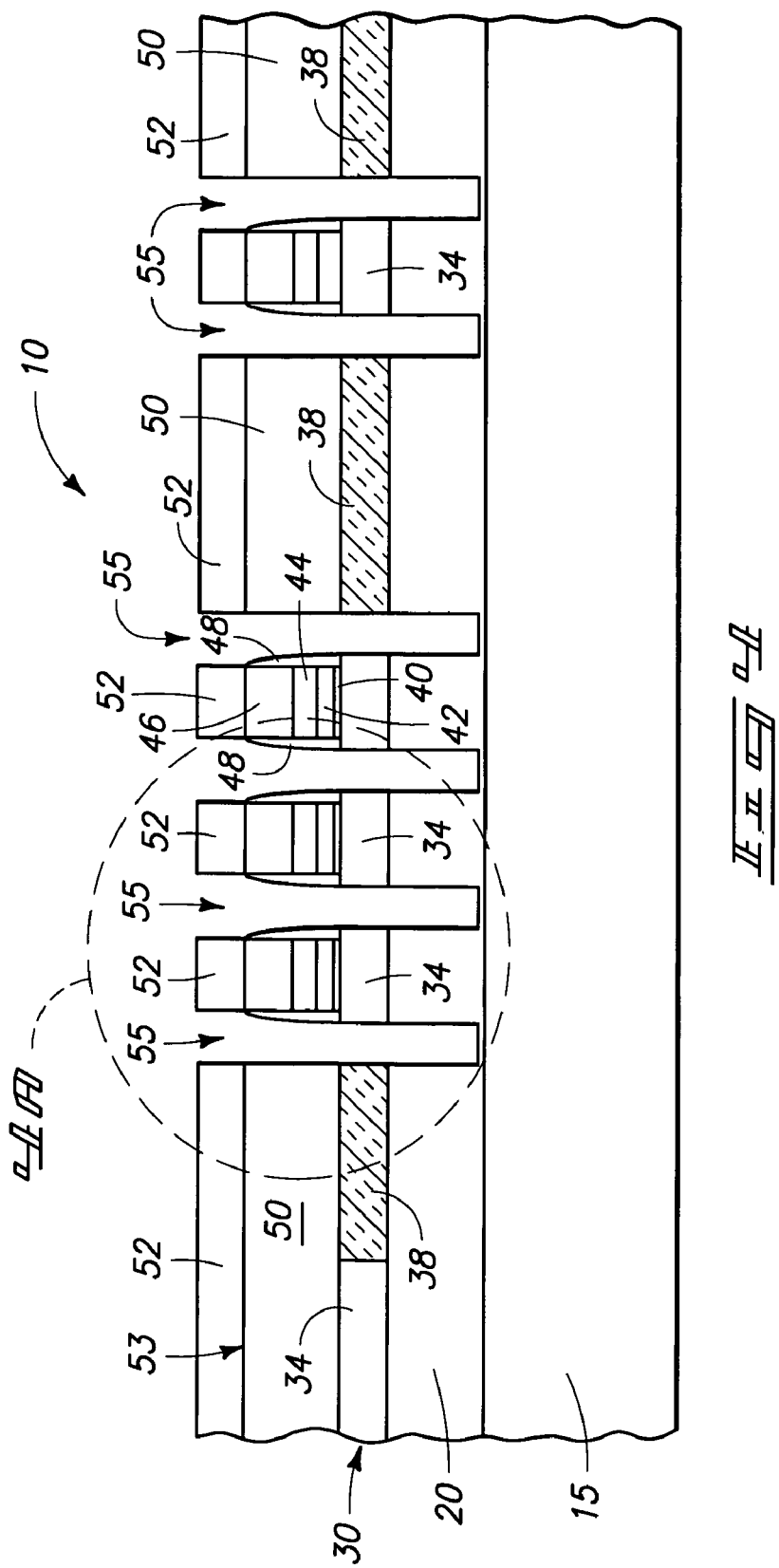
FIG. 4 depicts the structure of FIG. 2 after additional processing in accordance with embodiments of the present invention.
Figure 4A:
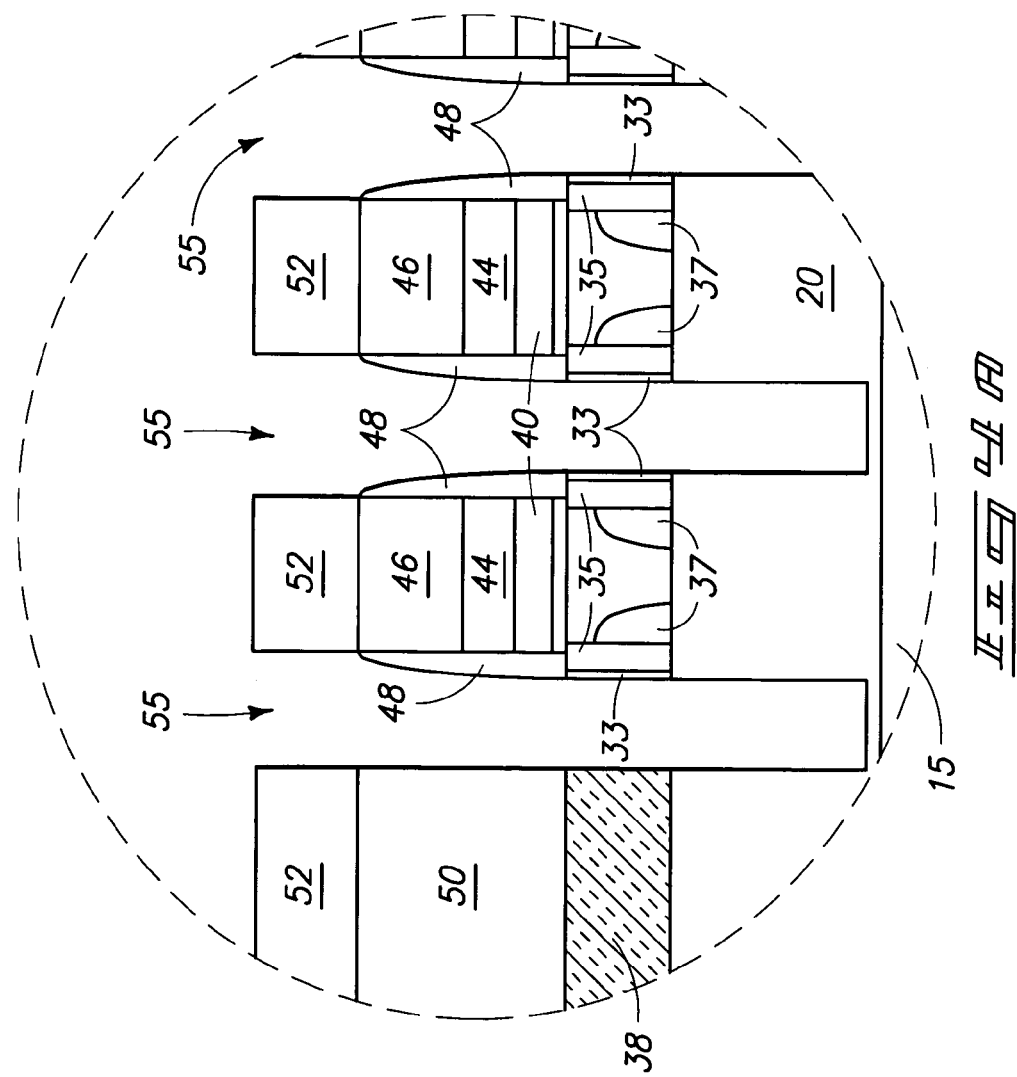
FIG. 4a is an enlarged cross-sectional view of the indicated portion of FIG. 4.

Turning now to FIGS. 4 and 4a, the structure of FIG. 3 is depicted after subsequent processing in accordance with embodiments of the present invention. Once the forming of first insulating layer 50 is complete, SOI substrate 10 is planarized to form an essentially planar upper surface 53 of layer 50. Generally, planarization is accomplished using a CMP process. Where first capping layer 46 encompasses silicon nitride, advantageously such capping layer 46 serves as a planarization stop such that upper surface 53 of layer 50 is essentially co-planar with an upper surface of such portions of capping layer 46. Alternatively, a timed CMP process can be employed such that upper surface 53 is elevationally above capping layer 46 (not shown). After planarization, a masking layer 52 is deposited and patterned to expose underlying portions of layer 50, and an etch process is employed to define contact openings 55.

Referring to FIG. 4a, it is seen that contact openings 55 are shown extending through first insulating layer 50, S/D regions 33 and into insulator layer 20. While not shown, in some embodiments of the present invention, S/D contact openings 55 extend through insulator layer 20 and into bulk substrate 15. It will be understood that the method employed for forming contact openings 55 is typically tailored for the specific materials of the several layers in which openings 55 are formed. Thus, in some embodiments of the present invention, an exemplary anisotropic etch is employed where the material of layer 50 is first etched with selectivity to the material of first spacers 48 such that no portion of gate electrode layer 42 or conducive layer 44 is exposed to opening 55. Such first etching can be followed with a second etch for selectively etching through the material of S/D regions 33, a third etch for selectively etching through the material of insulator layer 20, and in embodiments where opening 55 extends of bulk substrate 10, fourth etch for selectively etching the material of bulk substrate 10.

Figure 5:
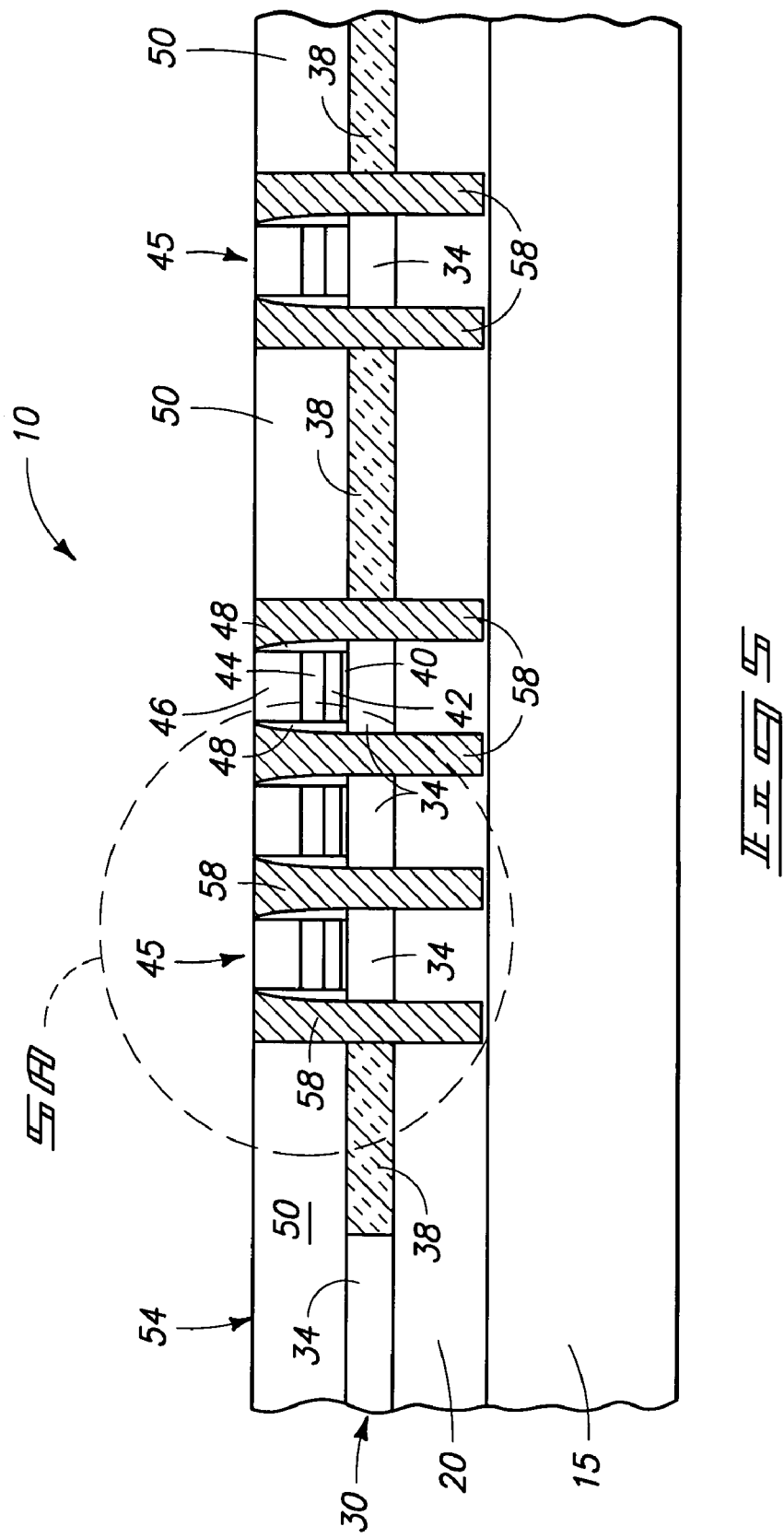
FIG. 5 depicts the structure of FIG. 4 after additional processing in accordance with embodiments of the present invention.
Figure 5A:
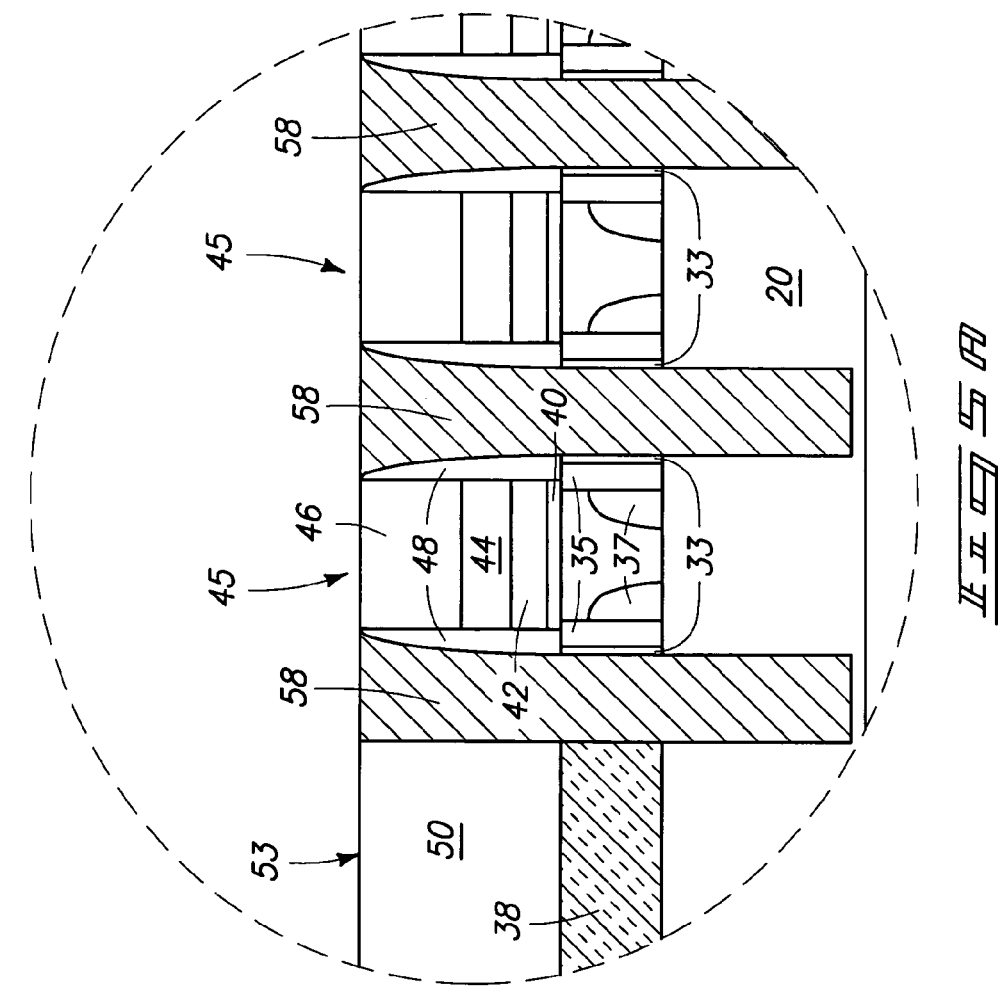
FIG. 5a is an enlarged cross-sectional view of the indicated portion of FIG. 5.

Turning now to FIGS. 5 and 5a, SOI wafer 10 is depicted after additional processing in accordance with embodiments of the present invention. Specifically, masking layer 52 is removed, contact openings 55 (FIG. 4) are filled with a conductive material and SOI wafer 10 planarized to form contact structures 58 and an essentially planar surface 54.

As will be seen below, the material selected for forming S/D contact structures 58 should exhibit good thermal stability characteristics during subsequent processing. In addition, as such material forms the electrical contact to S/D regions 33, the selected material should exhibit appropriate conductivity. Therefore, embodiments of the present invention typically employ a TiN/W material for filling contact openings 55. However, other materials such as polysilicon, can be advantageously formed using simpler processing. Thus while such polysilicon material, as known, will provide less conductivity than an otherwise equivalent TiN/W structure, embodiments of the present invention can employ polysilicon for contact structures 58 where appropriate.

Where a TiN/W material is used, generally, an initial layer of TiN, or any other appropriate "adhesion layer" material, is formed to a nominal thickness of about 30 nm; the TiN forming an essentially conformal layer over the exposed surfaces of opening 55. Subsequently, openings 55 are filled using a blanket CVD W deposition process which is followed by a CMP planarization process to complete the forming of contact structures 58. Where polysilicon is employed for contact structures 58, generally such is deposited in situ doped to provide appropriate conductivity for its purpose and is followed by a CMP planarization process to complete the forming of contact structures 58. Referring to FIG. 5a, it is seen that contact structures 58, encompass a first portion that is adjacent sidewall spacers 48 and a second portion that extend from the first portion through S/D regions 33 and into insulator layer 20, therebelow. Thus, structures 58, by filling openings 55 (FIG. 3a), provide electrical contact to S/D regions 33, and through such S/D regions 33 to first gate structures 45. Finally, it will be understood that while TiN/W and polysilicon materials are described herein as being advantageously used by embodiments of the present invention, such use is not to the exclusion of other materials that exhibit appropriate conductivity and thermal stability with respect to subsequent processing, as described below. Hence, such other materials are also within the scope and spirit of the present invention.

Figure 6:
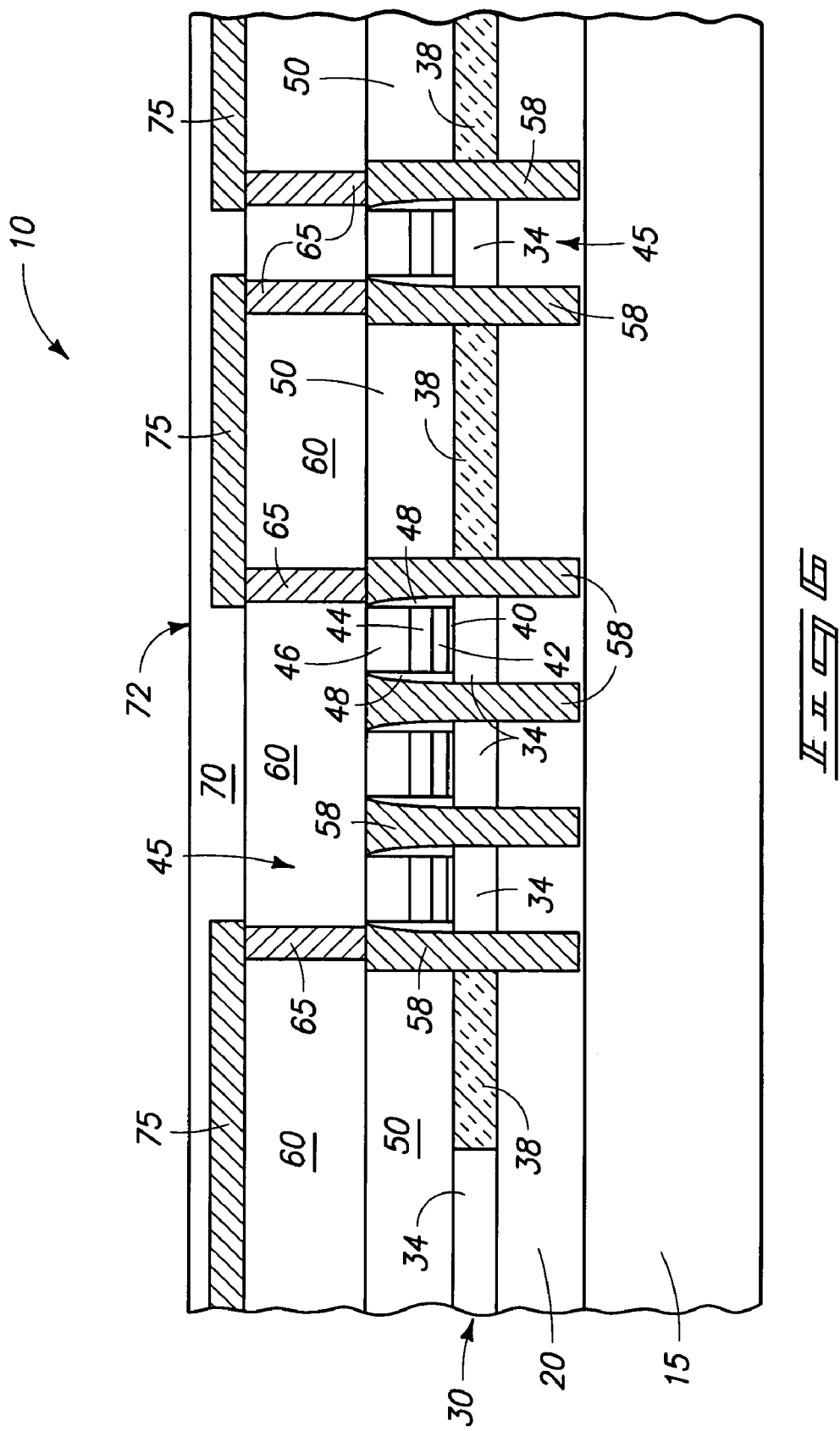
FIG. 6 depicts the structure of FIG. 5 after bonding to a handle wafer and additional processing in accordance with embodiments of the present invention.
Figure 11:
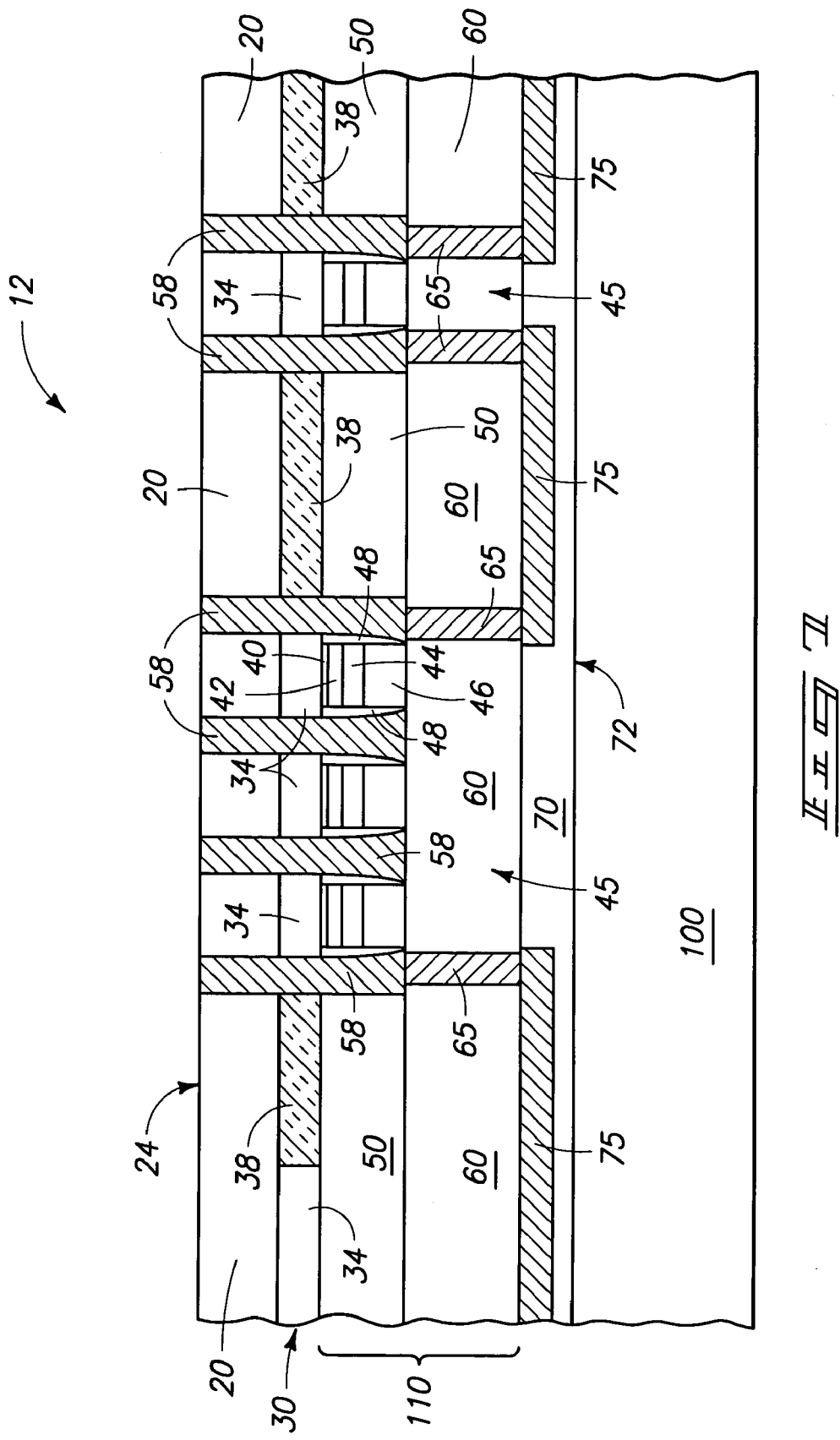

Referring to FIG. 6, SOI wafer portion 10 is shown after additional processing in accordance with embodiments of the present invention. As depicted, a second insulating layer 60 is shown overlying first layer 50 and first transistor gate structures 45. Via contact structures 65 are shown formed within second layer 60 and in contact with S/D contact structures 58 as well as conductive wiring structures 75 disposed over second insulating layer 60. Also shown is a third insulating layer 70 disposed overlying wiring structures 75 and second layer 60.

Second insulating layer 60 is generally a BPSG layer formed by conventional CVD processing to have a thickness in a range from about 500 nm to about 1200 nm with about 1000 nm being typical. Via contact structures 65 can be formed by conventional or other appropriate methods. Thus a masking layer (not shown) is formed and patterned, and openings formed and filled with a conductive material, generally a TiN/W material as described above, although in some embodiments, polysilicon is also appropriate. As discussed before with respect to S/D contact structures 58, the material selected for forming structures 65 should also exhibit appropriate conductivity and thermal stability with respect to subsequent processing. After forming such conductive fill material, some embodiments of the present invention complete the definition of structures 65 by planarization, for example a CMP process.

Once via contact structures 65 are completed and layer 60 planarized, generally a conductive material layer is deposited and patterned to form wiring structures 75. In some embodiments, an alternate damascene process is employed to form wiring structures 75. Embodiments of the present invention generally employ TiN/W for wiring structures 75 although other appropriate materials, for example polysilicon, copper or appropriate alloys of copper can also be used. As shown, wiring structures 75 are overlaid with third insulating layer 70 which encompasses a silicon oxide comprising material. Generally, embodiments in accordance with the present invention employ a conventional CVD process to form layer 70 which is followed by a planarization process, typically a CMP process, to form planarized surface 72. As will be described below, embodiments of the present invention employ layer 70 as a bonding or dielectric material layer. That is to say, in subsequent processing, a handle wafer will be bonded to SOI structure 10 at layer 70. Therefore a thickness of layer 70 is provided that is sufficient for such a purpose.

Turning to FIG. 7, SOI wafer portion 10 of FIG. 6 is shown after bonding to handle wafer 100, and other additional processing in accordance with embodiments of the present invention to form a bonded structure 12. It will be noted that FIG. 7 depicts the structures of the previous illustrations "flipped" or inverted such that, for example, wiring structures 75 are oriented downward in the present illustration as opposed to the orientation of FIG. 6.

As discussed above, the selection of conductive materials for the forming of S/D contact structures 58, via contact structures 65 and wiring structures 75 in embodiments of the present invention, was made with consideration of thermal stability during subsequent processing. The bonding of handle wafer 100 to SOI substrate is that subsequent processing. As known, generally, a silicon handle wafer is provided having an oxidized surface (not shown) which is pressed to a silicon oxide comprising layer disposed on a substrate, for embodiments of the present invention, layer 70. The pressed together structures are then heated to a bonding temperature of about 700° C., while pressed together, for a time sufficient for the bonding to occur. Where such a process is employed to form an initial SOI substrate, typically a device layer is exposed by lapping away bulk silicon such that the device layer overlies an insulator layer, the oxidized surfaces that were bonded, which overlies the handle wafer.

As shown in FIG. 7, however, for some embodiments in accordance with the present invention, the wafer bonding process forms a bonded substrate 12 having the previously formed first transistor structures and conductive structures disposed between handle wafer 100 and device layer 30. Thus, to relate the structure of FIG. 7 to a known initial SOI structure, insulating layers 50, 60 and 70 can be seen as the insulator layer, referred to herein as combined insulator layer 110. In addition, FIG. 7 depicts that original bulk substrate 15 is removed to expose a second side of original insulator layer 20 as well as portions of S/D contact structures 58. As seen, the exposed second side of layer 20 is opposite the first side of such layer which is adjacent device layer 30. Generally, material of bulk substrate 15 is removed by an initial lapping process, which removes most of the substrate material, and a subsequent polishing process, for example a CMP process, for providing a polished upper surface 24. Alternatively an implant and cleaving process can be used in combination with the CMP process. Advantageously, embodiments in accordance with the present invention use contact structures 58 as etch stop indicators for the planarization process, thus providing surface 24 that encompasses both exposed portions of a second side of layer 20 and S/D contact structures 58. Advantageously, S/D contact structures 58 can provide an etch stop for the exemplary CMP process such that surface 24 encompasses essentially coplanar portions of such structures 58 and the second side of layer 20, as depicted.

Figure 8B:
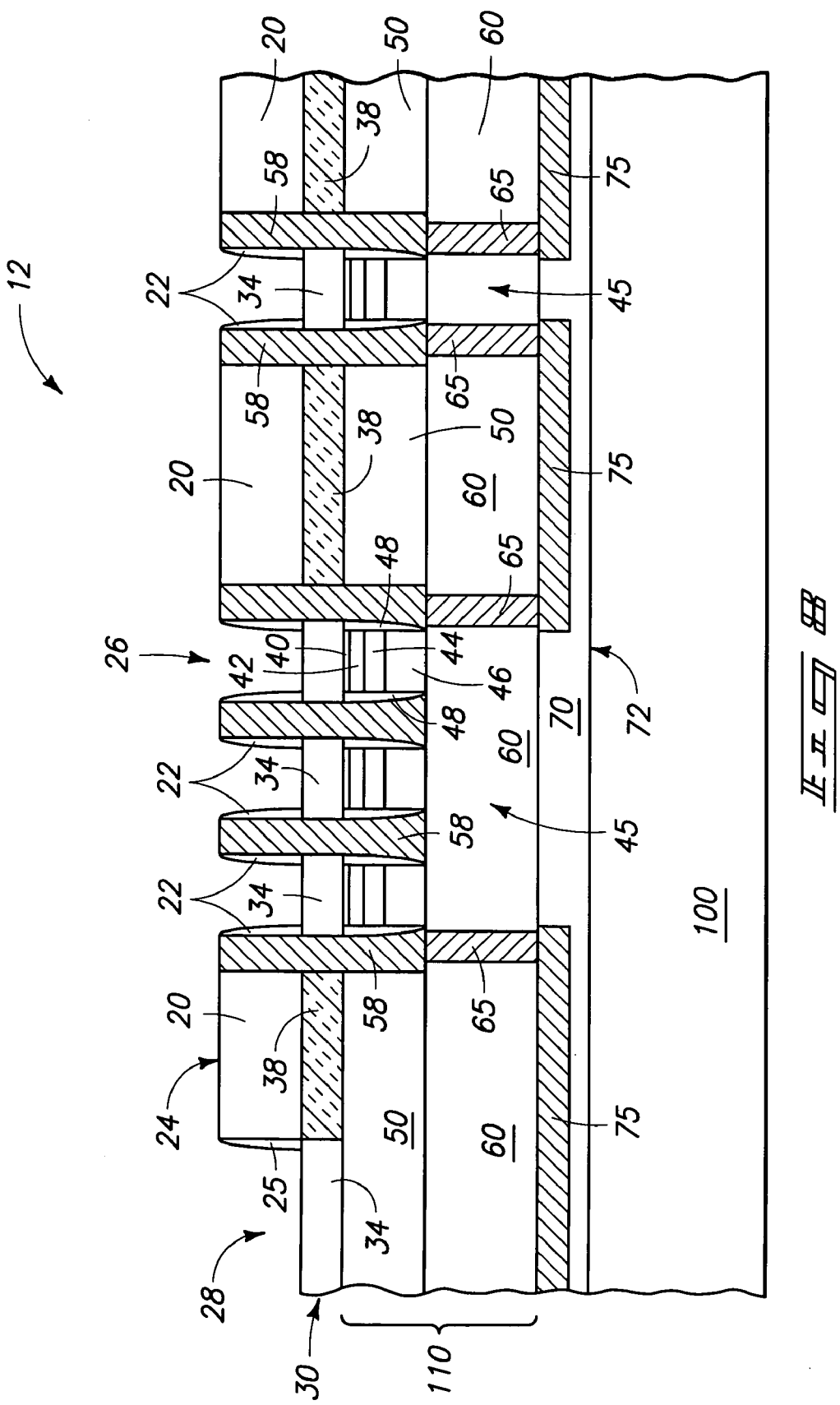
FIG. 8 depicts the structure of FIG. 7 after additional processing in accordance with embodiments of the present invention.

In FIG. 8, bonded substrate 12 is depicted after additional processing in accordance with an embodiment of the present invention. Specifically, portions of insulator layer 20 are removed from between adjacent S/D contact structures 58 to form openings 26. Such removal can be accomplished by depositing a masking layer (not shown) and patterning the layer to expose the desired areas of layer 20 which are then etched by an appropriate etching process that selectively removes the material of layer 20 and not the material of contact structures 58. In some embodiments of the present invention, an additional, peripheral portion of layer 20 is removed that is not disposed between two contact structures 58 to form peripheral opening or region 28. As will be described below, region 28 can be advantageously used for the forming of optional peripheral circuitry operably adjacent the second side of device layer 30 using conventional or other appropriate processing.

Once openings 26 are formed, second dielectric spacers 22 are formed laterally adjacent exposed sidewall portions of S/D contact structures 58. In some embodiments, where opening 28 is formed, additional dielectric spacers 25 can advantageously be formed in a common processing step. Dielectric spacers 22, and if formed, spacers 25 are formed by conventional or other methods, for example a layer of a dielectric material such as a silicon dioxide, silicon nitride or oxynitride comprising material is deposited and etched back to provide spacers 22 and 25.

Figure 9:
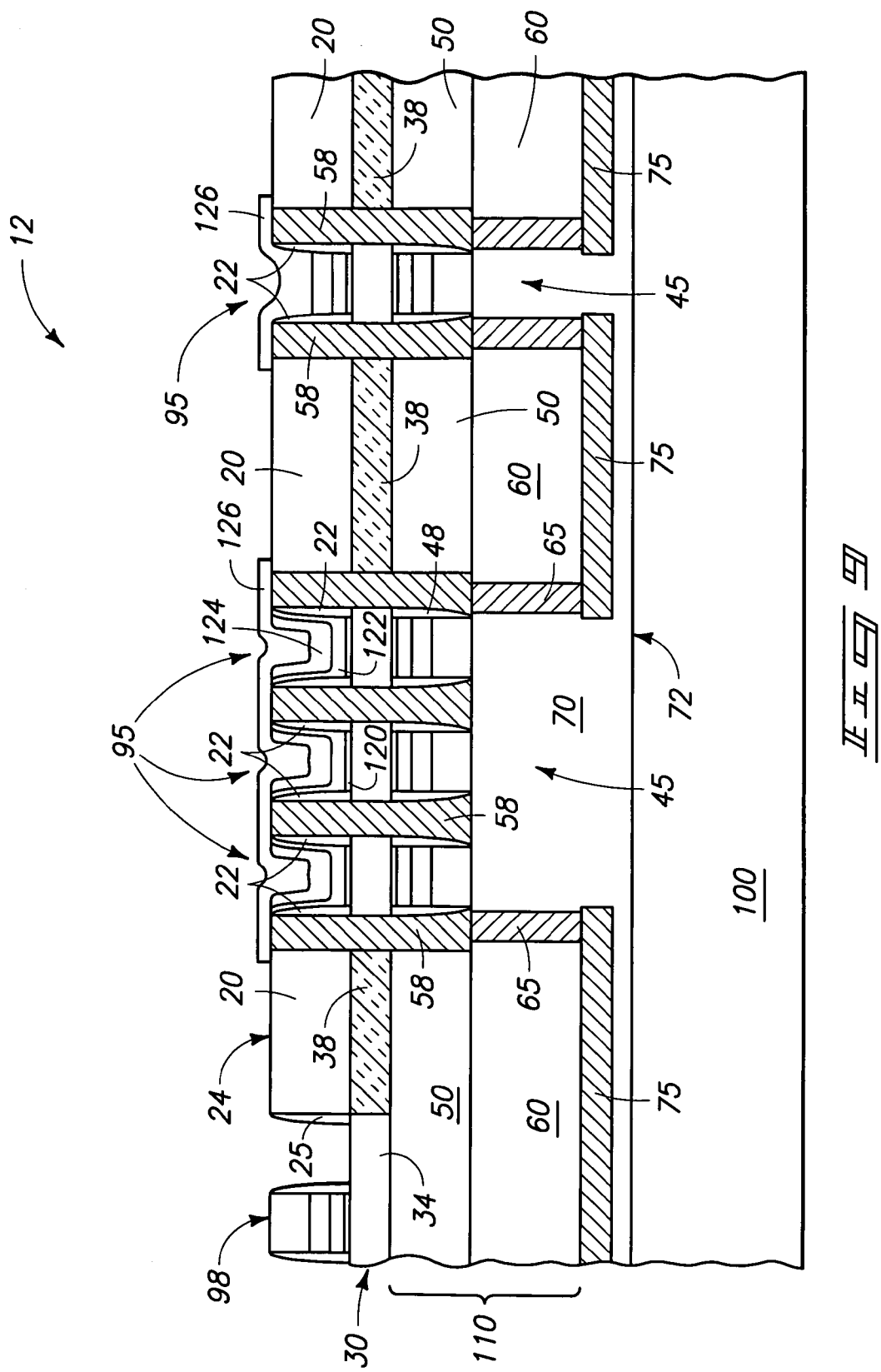
FIG. 9 depicts the structure of FIG. 8 after additional processing to form a second transistor gate structure in accordance with embodiments of the present invention.

Turning now to FIG. 9, structure 12 is shown after the forming of second transistor gate structures 95 and optional peripheral transistor gate structure 98, in accordance with embodiments of the present invention. Transistor structures 95, and if formed, transistor structure 98, are formed using conventional or other appropriate methods. However, it will be noted that preferred embodiments of the present invention advantageously provide that second transistor gate structures 95 are self-aligned to first transistor gate structures 45 and to the channel region therebetween. Thus unlike previously known methods for forming opposing dual-gated transistor structures, S/D contact structures 58 provide for the alignment of first and second transistor gate structures to one another. In addition, the self-alignment of the gate structures 45 and 95 provided by embodiments in accordance with the present invention, advantageously provide that such transistors employ common S/D contact structures.

To form second gate structures 95, a second gate dielectric 120 is first formed and a second gate electrode 122 is second formed such that gate electrode 122 overlies gate dielectric 120. Generally, the materials used for such second gate dielectric 120 and second gate electrode 122 are the same materials employed for the opposing first transistor structure 45, however in some embodiments of the present invention different materials and/or thickness are employed. Thus where a first dielectric 40 encompasses a silicon dioxide material, in some embodiments, second gate dielectric 120 can encompass any appropriate alternate material. Similarly, any appropriate material can be used for forming second gate electrode 122, second conductive layer 124 and second capping layer 126. Such appropriate materials can include materials that will provide different threshold voltages for such second transistors.

After forming second dielectric 120, second gate electrode 122, second conductive layer 124, transistors 95 are isolated from one another employing a CMP or an etching process. After isolation, second capping layer 126 is formed. For example, by such methods as described for the analogous first conductive layer 44 and first capping layer 46. Some embodiments of the present invention employ alternate materials for second layer 124 and second layer 126, formed by methods appropriate for the specific material selected. For example, where first capping layer 46 is formed of a silicon nitride comprising material employing a CVD process, second capping layer 126 can be formed of a silicon dioxide comprising material using a different, appropriate CVD process. It will be noted, that regardless of the process or material employed for forming capping layer 126, typically such layer 126 is formed having a portion overlying surface 24 of insulator layer 20 as depicted.

It will be noted, that in addition to second gate structure 95 being self-aligned to first transistor gate structure 45, most of such structure is formed laterally adjacent and between dielectric spacers 22 such that the lateral dimensions of each of the gate dielectric 120, the gate electrode 122, the conductive layer 124 and a significant portion of capping layer 126 are fixed by the spacing between such spacers 22 and thus have essentially the same lateral dimension as first gate structure 45. Therefore, preferred embodiments in accordance with the present invention advantageously do not require a separate etching step to define a lateral dimension for second gate structure 95. It will be understood that an advantageous benefit of embodiments of the present invention is a reduced lateral dimension of the gate structures as compared to previously known methods. Such a reduced lateral dimension being the result of not having to provide an "over-sized" gate structure for proper alignment of the first and second transistor gate structures. Furthermore the S/D capacitive coupling with the gate is reduced compared with known prior art.

Still referring to FIG. 9, after the forming of second capping layer 126, generally some or all of such layer overlying surface 24 is removed. Where some of layer 126 is removed, as depicted, a conventional masking and etching process is typically employed. For embodiments of the present invention where all of capping layer 126 overlying surface 24 is removed, generally a planarization process, such as a CMP process, is employed.

Where optional third transistor gate structure 98 is provided, generally such structure is typically formed, at least in part, concurrently with second structure 95. As such third gate structure 98 is not self-aligned to an underlying first gate structure 45, and as such third structure is not formed laterally adjacent and between spacers 22, third gate structure 98, lateral dimensions of such structure are provided by a appropriate processing. Thus in some embodiments of the present invention, an etching process is employed to define both third gate structure 98 and to remove portions of capping layer 126 overlying surface 24. Finally, as third gate structure 98 does not share a channel region or S/D regions with an opposing gate structure, embodiments of the present invention provide for appropriate channel tailoring and S/D forming processes as are generally employed to provide such structures and/or regions, where such regions are required.

In compliance with the statute, the invention has been described in language more or less specific as to structural and methodical features. It is to be understood, however, that the invention is not limited to the specific features shown and described, since the means, methods and structures herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a transistor device, comprising:
providing a layer of insulative material over a substrate material;
forming a semiconductive layer over the layer of insulative material, the semiconductive layer having a first side disposed against the layer of insulative material and having an opposing second side;
forming a first contact structure and a second contact structure extending at least partially through the layer of insulative material, a portion of the layer of insulative material being disposed between the first and second contact structures;
after forming the first and second contact structures, removing the substrate material and removing the portion of the layer of insulative material disposed between the first and second contact structures; and
forming a gate structure disposed on the first side of the semiconductive layer between the first and second contact structures.

2. The method of claim 1 further comprising, prior to forming the first and second contact structures, forming at least one isolation region within the semiconductive layer.

3. The method of claim 1 wherein prior to removing the substrate material, each of the first and second contact structures extends into the substrate material.

4. The method of claim 1 wherein the gate structure is a first gate structure and wherein a second gate structure is provided vertically aligned with the first gate structure between the first and second contact structures.

5. The method of claim 1 wherein the first and second contact structures comprises at least one of TiN, W and polysilicon.

6. The method of claim 1 further comprising:
prior to removing the substrate material, forming an insulating layer over the first and second contact structures;
forming openings through the insulating layer to expose a surface of each of the first and second contact structures; and
filling the openings with a conductive material.

7. A method of forming a dual-gate structure comprising:
providing a first gate structure disposed over a first side of an insulative material, a second side of the insulative material being against a substrate material;
forming a first contact structure extending into the insulative material on a first side of the gate structure and a second contact structure extending into the insulative material on a second side of the gate structure, a portion of the insulative material being disposed between the first and second contact structures;
after forming the first and second contact structures, removing the substrate material;
removing the portion of insulative material disposed between the first and second contact structures; and
forming a second gate structure vertically aligned with the first gate structure between the first and second contact structures.

8. The method of claim 7 wherein each of the first and second gate structures comprises a pair of dielectric sidewall spacers.

9. The method of claim 7 wherein a layer of semiconductive material is disposed between the first gate structure and the second gate structure.

* * * * *

UNITED STATES PATENT AND TRADEMARK OFFICE
CERTIFICATE OF CORRECTION

PATENT NO. : 7,064,036 B2  Page 1 of 1
APPLICATION NO. : 10/932192
DATED : June 20, 2006
INVENTOR(S) : Zahurak et al.

It is certified that error appears in the above-identified patent and that said Letters Patent is hereby corrected as shown below:

On the title page item (56) References Cited, U.S. Patent Documents - delete "5,154,661 A 10/1992 Higgins 62/3.3; 5,259,737 A 11/1993 Kamisuki et al. 417/322; 5,313,094 A 5/1994 Beyer et al. 257/622; 5,569,950 A 10/1996 Lewis et al. 257/467; 5,753,529 A 5/1998 Chang et al. 437/67; 5,757,081 A 5/1998 Chang et al. 257/788; 5,759,014 A 6/1998 Van Lintel 417/413.3; 5,767,578 A 6/1998 Chang et al. 257/717; 6,080,608 A 6/2000 Nowak 438/151".

(56) References Cited, Other Publications - delete "Larry Gilg et al., "Die Products: ideal IC packaging for demanding applications", Electronic Design, Dec. 23, 2002, pp. 47-50.; M. Armacost et al., "Plasma-etching processes for ULSI semiconductor circuits", IBM J. Res. Develop., vol. 43, No. 1/2, Jan./Mar. 1999, pp. 39-72.".

Column 3, Line 31 - Replace "substrate. 15" with --substrate 15--.

Signed and Sealed this

Fifteenth Day of January, 2008

JON W. DUDAS
*Director of the United States Patent and Trademark Office*